(12) United States Patent
Donohoe

(10) Patent No.: US 6,921,725 B2  
(45) Date of Patent: Jul. 26, 2005

(54) ETCHING OF HIGH ASPECT RATIO STRUCTURES

(75) Inventor: Kevin G. Donohoe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 209 days.

(21) Appl. No.: 09/894,460

(22) Filed: Jun. 28, 2001

(65) Prior Publication Data

US 2003/0003755 A1 Jan. 2, 2003

(51) Int. Cl.$^7$ .................... H01L 21/302; H01L 21/461
(52) U.S. Cl. ................ 438/723; 438/787; 438/725; 438/724; 438/710; 438/711; 438/714; 438/706
(58) Field of Search .................. 438/787, 706, 438/710, 711, 723, 719, 714, 734, 694, 724, 795, 738, 725, 695

(56) References Cited

U.S. PATENT DOCUMENTS

| | | |
|---|---|---|
| 4,717,448 A | 1/1988 | Cox et al. |
| 5,100,505 A | 3/1992 | Cathey, Jr. |
| 5,185,058 A | 2/1993 | Cathey, Jr. |
| 5,227,750 A | 7/1993 | Frank |
| 5,296,095 A | 3/1994 | Nabeshima et al. |
| 5,409,563 A | 4/1995 | Cathey |
| 5,423,941 A | 6/1995 | Komura et al. |
| 5,470,768 A | 11/1995 | Yanai et al. |
| 5,472,564 A | 12/1995 | Nakamura et al. |
| 5,492,597 A | 2/1996 | Keller |
| 5,522,966 A | 6/1996 | Komura et al. |
| 5,578,161 A | 11/1996 | Auda |
| 5,605,603 A | 2/1997 | Grimard et al. |
| 5,685,950 A | 11/1997 | Sato |
| 5,756,216 A | 5/1998 | Becker et al. |
| 5,756,401 A | 5/1998 | Iizuka |
| 5,759,922 A | 6/1998 | Donohoe |
| 5,783,100 A | 7/1998 | Blalock et al. |
| 5,843,226 A | 12/1998 | Zhao et al. |
| 5,869,845 A | 2/1999 | Vander Wagt et al. |
| 5,871,659 A | 2/1999 | Sakano et al. |
| 5,874,362 A * | 2/1999 | Wong et al. ............. 438/719 |
| 5,882,535 A | 3/1999 | Stocks et al. |
| 5,906,950 A | 5/1999 | Keller et al. |
| 6,020,270 A | 2/2000 | Wong et al. |
| 6,025,276 A | 2/2000 | Donohoe et al. |
| 6,051,863 A * | 4/2000 | Hause et al. ............. 257/369 |
| 6,069,091 A * | 5/2000 | Chang et al. ............. 438/719 |
| 6,074,957 A | 6/2000 | Donohoe et al. |
| 6,093,655 A | 7/2000 | Donohoe et al. |
| 6,123,862 A | 9/2000 | Donohoe et al. |
| 6,163,066 A | 12/2000 | Forbes et al. |
| 6,180,533 B1 | 1/2001 | Jain et al. |
| 6,204,143 B1 | 3/2001 | Roberts et al. |
| 6,235,643 B1 * | 5/2001 | Mui et al. ............. 438/719 |
| 6,451,705 B1 | 9/2002 | Trapp et al. |
| 6,565,721 B1 | 5/2003 | Blalock et al. |
| 6,743,727 B2 | 6/2004 | Mathad et al. |

* cited by examiner

Primary Examiner—Matthew Smith  
Assistant Examiner—Igwe U. Anya  
(74) Attorney, Agent, or Firm—Leffert Jay & Polglaze, P.A.

(57) ABSTRACT

Plasma etching processes using a plasma containing fluorine as well as bromine and/or iodine are suited for high aspect ratio etching of trenches, contact holes or other apertures in silicon oxide materials. The plasma is produced using at least one fluorine-containing source gas and at least one bromine- or iodine-containing source gas. Bromine/iodine components of the plasma protect the aperture sidewalls from lateral attack by free fluorine, thus advantageously reducing a tendency for bowing of the sidewalls. Ion bombardment suppresses absorption of bromine/iodine components on the etch front, thus facilitating advancement of the etch front without significantly impacting taper.

56 Claims, 3 Drawing Sheets

ETCHING OF HIGH ASPECT RATIO STRUCTURES

TECHNICAL FIELD OF THE INVENTION

The present invention relates generally to methods of forming apertures in a dielectric layer and, more particularly, to methods of controlling profile in high aspect ratio contact apertures formed in silicon oxide materials.

BACKGROUND OF THE INVENTION

To meet demands for faster processors and higher capacity memories, integrated circuit (IC) designers are focusing on decreasing the minimum feature size within integrated circuits. By minimizing the feature size within an integrated circuit, device density on an individual chip increases exponentially, as desired, enabling designers to meet the demands imposed on them. One such feature is the so-called contact aperture, or "contact," which is typically a circular hole extending through a layer of dielectric material to a structure formed on or in an underlying semiconductor substrate.

As circuit component structures, including contacts, enter the sub-half micron range of dimensions, tolerances become more critical and demand more precise process parameters. For example, sub-half micron contacts must hold the top contact diameter (top CD) within a narrow tolerance band while a high aspect ratio contact is etched through a dielectric layer, and the contact itself must exhibit a substantially cylindrical cross section (i.e., little taper) to achieve an effective contact area with the underlying substrate. As used herein, the term "high aspect ratio" as applied to contact structures is currently contemplated to indicate a depth to width, or diameter, ratio of about five to one or more ($\geq 5:1$). In addition to contacts, it is also necessary in some instances to etch high aspect ratio sub-half micron width lines or trenches through dielectric layers, and fabrication of these structures demands similar precision. Mixtures of these structures, i.e., holes and trenches, are common in semiconductor fabrication, particularly in those using dual-damascene techniques.

It is highly desirable to etch high aspect ratio contacts through a layer of doped silicon dioxide such as borophosphosilicate glass, or BPSG, and sometimes through additional layers such as other oxides, silicon nitride or inorganic, dielectric anti-reflective coating (DARC) films between the mask and the substrate silicon. Desired contact structures to be achieved would have a minimum nominal depth of 1–2 $\mu$m, an aspect ratio of approximately 5:1 to 10:1 or higher, and a profile angle of greater than approximately 87° as measured from a horizontal plane of the substrate. High selectivity for BPSG to the substrate silicon is preferred, as is the ability to etch the other films, such as the aforementioned silicon nitride and DARC films.

For the reasons stated above, and for other reasons stated below that will become apparent to those skilled in the art upon reading and understanding the present specification, there is a need in the art for alternative methods for producing high aspect ratio structures.

SUMMARY

Embodiments described herein utilize a plasma etching process with a plasma containing fluorine, as well as bromine and/or iodine for etching high aspect ratio trenches, contact holes or other apertures in silicon oxide materials. The plasma is produced using at least one fluorine-containing source gas, such as a perfluorocarbon or hydrofluorocarbon gas, and at least one bromine- or iodine-containing source gas, such as hydrogen bromide, hydrogen iodide, a bromine- or iodine-substituted fluorocarbon or a bromine- or iodine-substituted hydrofluorocarbon. Bromine/iodine components of the plasma protect the aperture sidewalls from lateral attack by free fluorine, thus advantageously reducing a tendency for bowing of the sidewalls. Ion bombardment suppresses absorption of bromine/iodine components on the etch front, thus facilitating advancement of the etch front without significantly impacting taper. Such methods are particularly advantageous in forming very high aspect ratios of 8:1 or higher.

For one embodiment, the invention provides a method of forming an aperture in a silicon oxide layer. The method includes generating a plasma containing fluorine and bromine and/or iodine, accelerating ions from the plasma toward a surface of the silicon oxide layer, and etching an exposed portion of the silicon oxide layer, thereby advancing an etch front into the silicon oxide layer and forming the aperture having sidewalls. The method further includes absorbing or depositing bromine and/or iodine components on the sidewalls of the aperture and continuing to advance the etch front and absorb bromine and/or iodine components on the sidewalls of the aperture until a desired aspect ratio is attained. The bromine and/or iodine content is sufficient to produce a taper angle of the sidewalls of greater than about 87°.

For another embodiment, the invention provides a method of forming an aperture in a silicon oxide layer. The method includes generating a plasma containing fluorine and bromine, accelerating ions from the plasma toward a surface of the silicon oxide layer, and etching an exposed portion of the silicon oxide layer, thereby exposing sidewalls of the silicon oxide layer. The method further includes absorbing or depositing components containing bromine on the sidewalls of the silicon oxide layer and continuing to etch the exposed portion of the silicon oxide layer and to absorb or deposit components containing bromine on the sidewalls of the silicon oxide layer until an aperture having a desired aspect ratio is attained. A content of the bromine in the plasma is sufficient to produce a taper angle of the sidewalls of greater than about 87°.

For yet another embodiment, the invention provides a method of forming an aperture in a silicon oxide layer. The method includes generating a plasma containing fluorine and iodine, accelerating ions from the plasma toward a surface of the silicon oxide layer, and etching an exposed portion of the silicon oxide layer, thereby exposing sidewalls of the silicon oxide layer. The method further includes absorbing or depositing components containing iodine on the sidewalls of the silicon oxide layer and continuing to etch the exposed portion of the silicon oxide layer and to absorb or deposit components containing iodine on the sidewalls of the silicon oxide layer until an aperture having a desired aspect ratio is attained. A content of the iodine in the plasma is sufficient to produce a taper angle of the sidewalls of greater than about 87°.

For a further embodiment, the invention provides a method of forming an aperture in a silicon oxide layer. The method includes generating a plasma comprising at least one first source gas and at least one second source gas. Each first source gas is a fluorocarbon gas and each second source gas is either a bromine-containing gas or an iodine-containing gas. The method further includes accelerating ions from the plasma perpendicularly toward a surface of the silicon oxide layer and advancing an etch front in the silicon oxide layer, thereby exposing sidewalls of the silicon oxide layer. The method still further includes absorbing or depositing components from the plasma on the sidewalls of the silicon oxide layer, wherein the absorbed or deposited components may be bromine-containing components and/or iodine-containing components. The absorbed or deposited components are sufficient to passivate the sidewalls of the silicon oxide layer from attack by fluorine-containing components of the plasma. The method still further includes continuing to advance the etch front until a desired aspect ratio is attained, wherein the desired aspect ratio is greater than about 8:1.

For a still further embodiment, the invention provides a method of forming an aperture in a silicon oxide layer. The method includes generating a plasma comprising at least one first source gas and at least one second source gas, wherein each first source gas is a fluorocarbon gas and each second source gas is a bromine-containing gas and/or an iodine-containing gas. The method further includes accelerating ions from the plasma perpendicularly toward a surface of the silicon oxide layer and advancing an etch front in the silicon oxide layer, thereby exposing sidewalls of the silicon oxide layer. The method still further includes forming a polymer residue on the sidewalls of the silicon oxide layer and brominating and/or iodizing the polymer residue on the sidewalls of the silicon oxide layer, thereby passivating the polymer residue from attack by fluorine-containing components of the plasma. The method still further includes continuing to advance the etch front until a desired aspect ratio is attained, wherein the desired aspect ratio is greater than about 5:1.

Further embodiments of the invention include methods of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Embodiments described herein utilize a plasma etching process with a plasma containing fluorine as well as bromine and/or iodine for etching high aspect ratio trenches, contact holes or other apertures in silicon oxide materials. The plasma is produced using at least one fluorine-containing source gas, such as a perfluorocarbon or hydrofluorocarbon gas, and at least one bromine- or iodine-containing source gas, such as hydrogen bromide, hydrogen iodide, a bromine- or iodine-substituted fluorocarbon or a bromine- or iodine-substituted hydrofluorocarbon. Bromine/iodine components of the plasma protect the aperture sidewalls from lateral attack by free fluorine, thus advantageously reducing a tendency for bowing of the sidewalls.

Various embodiments further utilize ion bombardment during the etching process. Ions accelerated at and impinging upon the etch front will tend to dislodge bromine/iodine components absorbed or deposited on the etch front, thus allowing free fluorine and fluorine-containing ions to advance the etch front. By facilitating advancement of the etch front while reducing lateral attack, the resulting aperture can be formed with improved profile at aspect ratios of 5:1, 8:1, 10:1 and higher, and with top widths of less than 0.3 $\mu$m.

Figure 1:
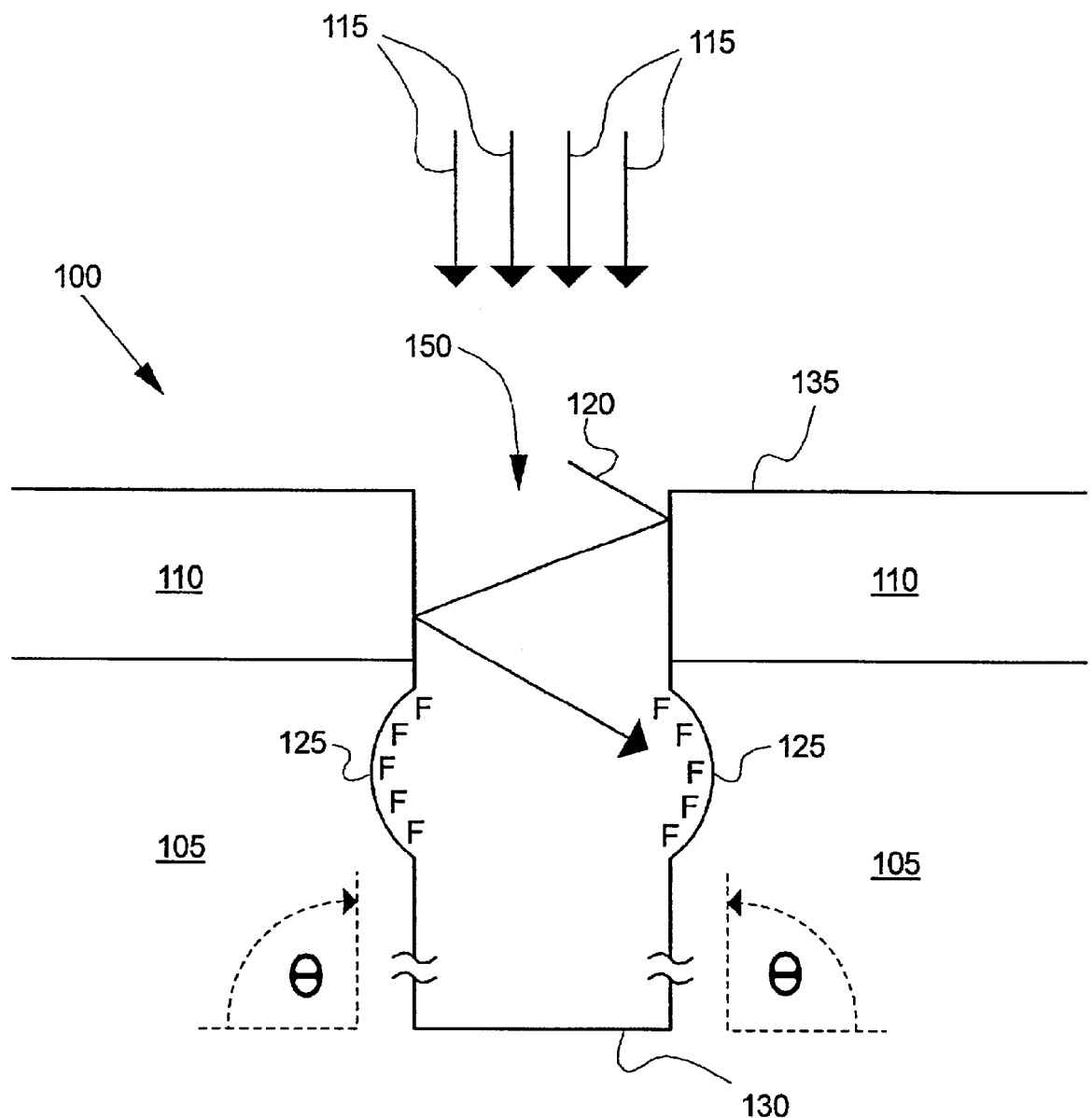
FIG. 1 is a cross-sectional view of a portion of an integrated circuit device showing formation of an aperture in a silicon oxide layer in a typical fluoride etch process.

FIG. 1 is a cross-sectional view of a portion of an integrated circuit device 100 showing formation of an aperture 150 in a silicon oxide layer 105 in a typical fluoride etch process. The silicon oxide layer 105 may be a doped or undoped silicon oxide material. Some examples include silicon dioxide ($SiO_2$), tetraethylorthosilicate (TEOS), silicon oxynitrides ($SiO_xN_y$), borosilicate glass (BSG), phosphosilicate glass (PSG) and borophosphosilicate glass (BPSG).

A mask 110 is formed and patterned on the silicon oxide layer 105 in a manner well known in the art, e.g., by standard photolithographic techniques. Ions 115 are generated in a plasma etch process and directed toward the surface 135 of the integrated circuit device 100. Examples of equipment and techniques for plasma etching are described in U.S. Pat. No. 6,123,862 issued Sep. 26, 2000 to Donohoe et al., which is commonly assigned. In general, a plasma is formed over the surface 135 of the device 100 and a bias power is supplied to the substrate containing the device 100, or to a support or chuck supporting the substrate, to accelerate the ions 115 toward the surface 135. The fluorine-ions impinging on the exposed silicon oxide layer 105 advance the etch front 130. During etching, a polymer residue (not shown in FIG. 1) may form on the sidewalls of the aperture 150. This polymer residue is often purposefully formed in order to minimize bowing, but such polymer residue also can detrimentally impact taper.

The processing described with reference to FIG. 1 can produce an acceptable taper, measured as angle θ relative to a plane horizontal to the surface 135, at lower aspect ratios. Taper angles are preferably greater than about 87° and preferably no greater than approximately 90°. More acute angles, i.e., angles less than 87°, cause detrimental reductions in aperture width or diameter while less acute angles, i.e., angles greater than 90°, cause detrimental reentrant profiles. Reducing taper angles is referred to as increasing taper while increasing taper angles is referred to as decreasing taper.

As an example of the effect of taper angle, at an 87° taper angle, the bottom of a contact hole theoretically will be approximately 60% of its top diameter at an aspect ratio of 8:1 or a loss of diameter of approximately 40%. At an 85° taper angle, the loss of diameter will be in excess of approximately 70% at an aspect ratio of 8:1; the aspect ratio would have to be reduced to less than 5:1 to maintain of diameter loss of around 40% or less. And at an 82° taper angle, an aspect ratio of 8:1 cannot theoretically be reached as the bottom diameter will pinch shut; the aspect ratio would have to be reduced to around 3:1 to maintain a diameter loss of around 40% or less. Accordingly, maintaining desirable taper becomes increasingly important as the desired aspect ratio, and the resulting etch depth, increases.

To maintain desirable taper as the aspect ratio increases, etch conditions generally must be altered, such as increasing the fluorine content of the etchant or increasing the energy of the ions 115. These etch conditions used to maintain taper at higher aspect ratios will detrimentally lead to increased levels of free fluorine 120 and a resulting propensity for bowing 125. Bowing 125 is generally formed by the reaction of free fluorine 120 on sidewalls of the aperture 150. Because the free fluorine 120 is a neutral, it cannot be accelerated perpendicularly toward the surface 135 as with the ions 115. The free fluorine 120 will thus tend to "bounce" into the aperture 150 and tend to accumulate toward the top of the aperture 150. The accumulated free fluorine 120 laterally etches the sidewalls producing the characteristic bowing 125. High-density source gases, e.g., high-order fluorocarbons, are preferred for generation of the plasma. However, such high-density source gases also have a tendency to produce higher levels of free fluorine.

Figure 2A:
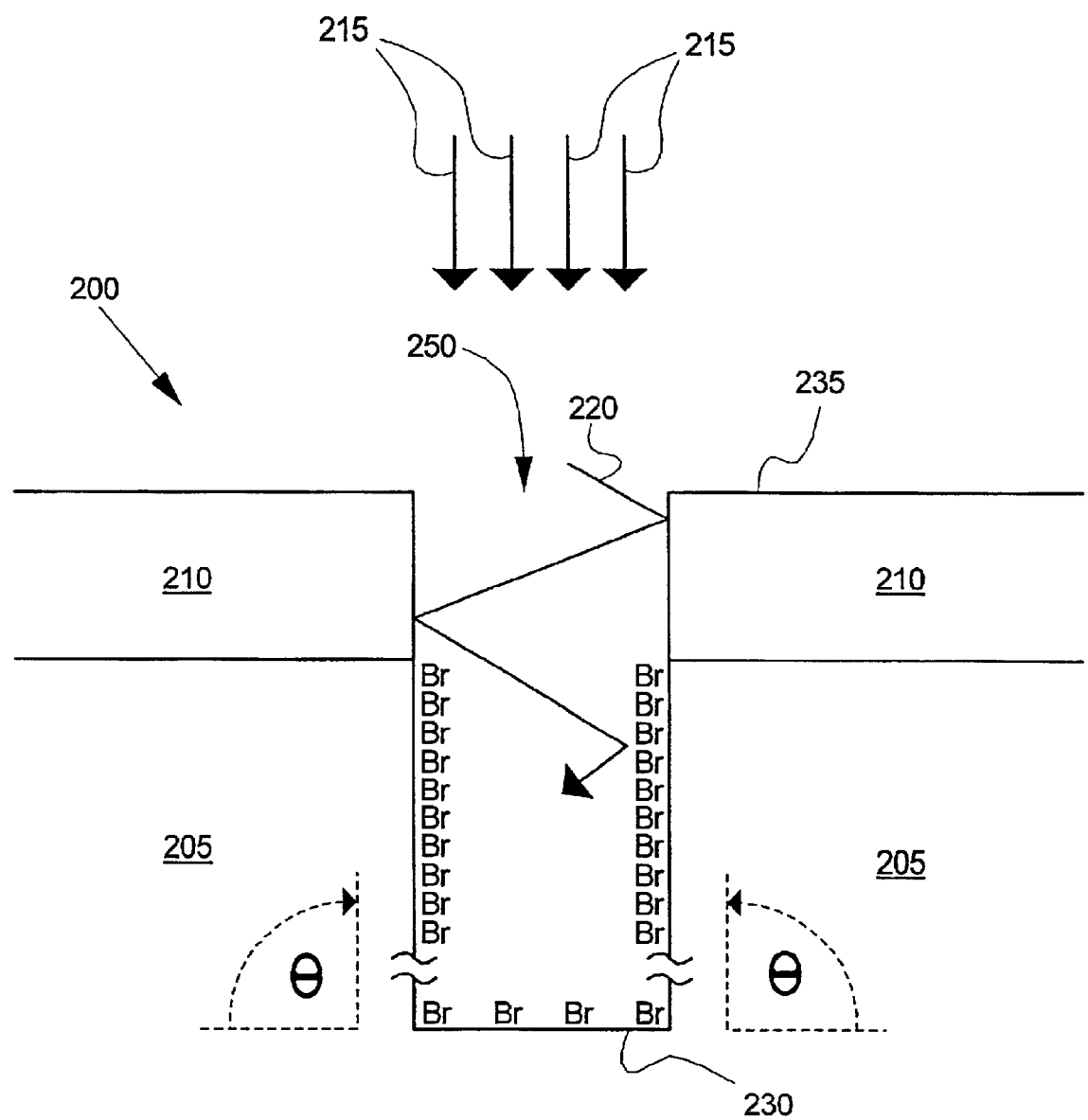
FIGS. 2A–2B are cross-sectional views of a portion of an integrated circuit device showing formation of an aperture in a silicon oxide layer in accordance with embodiments of the invention.

FIG. 2A is a cross-sectional view of a portion of an integrated circuit device 200 showing formation of an aperture 250 in a silicon oxide layer 205 in an etch process in accordance with an embodiment of the invention. The silicon oxide layer 205 may be a doped or undoped silicon oxide material. Some examples include silicon dioxide ($SiO_2$), tetraethylorthosilicate (TEOS), silicon oxynitrides ($SiO_xN_y$), borosilicate glass (BSG), phosphosilicate glass (PSG) and borophosphosilicate glass (BPSG).

A mask 210 is formed and patterned on the silicon oxide layer 205 in a manner well known in the art, e.g., by standard photolithographic techniques. Ions 215 are generated in a plasma etch process and directed toward the surface 235 of the integrated circuit device 200 as was described with reference to FIG. 1. Ions 215 generated in the plasma are accelerated toward the surface 235. Ions 215 impinging on exposed portions of the silicon oxide layer 205 advance the etch front 230.

The plasma is generated using at least one fluorine-containing source gas and at least one bromine- or iodine-containing source gas. For one embodiment, the composition of the plasma is modified during the etch process such that the bromine- or iodine-containing source gas is not added to the plasma until the etch front 230 advances into the silicon oxide layer 205. The fluorine-containing source gases are fluorocarbon gases including perfluorocarbon or hydrofluorocarbon gases. Some examples include $CHF_3$ (trifluoromethane), $CH_2F_2$ (difluoromethane), $C_2HF_5$ (pentafluoroethane), $C_3F_6$ (perfluoropropene), $C_3F_8$ (perfluoropropane) and $C_4F_8$ (perfluorobutene), as well as higher order perfluorocarbons and other hydrofluorocarbons. Some examples of bromine- or iodine-containing source gases include HBr (hydrogen bromide), HI (hydrogen iodide), $CF_3Br$ (bromotrifluoromethane) and $CF_3I$ (iodotrifluoromethane), as well as additional bromine- or iodine-substituted fluorocarbons or bromine- or iodine-substituted hydrofluorocarbons. For one embodiment, the fluorine-containing source gas contains difluoromethane. For a further embodiment, the plasma is generated using difluoromethane and hydrogen bromide.

Figure 2B:
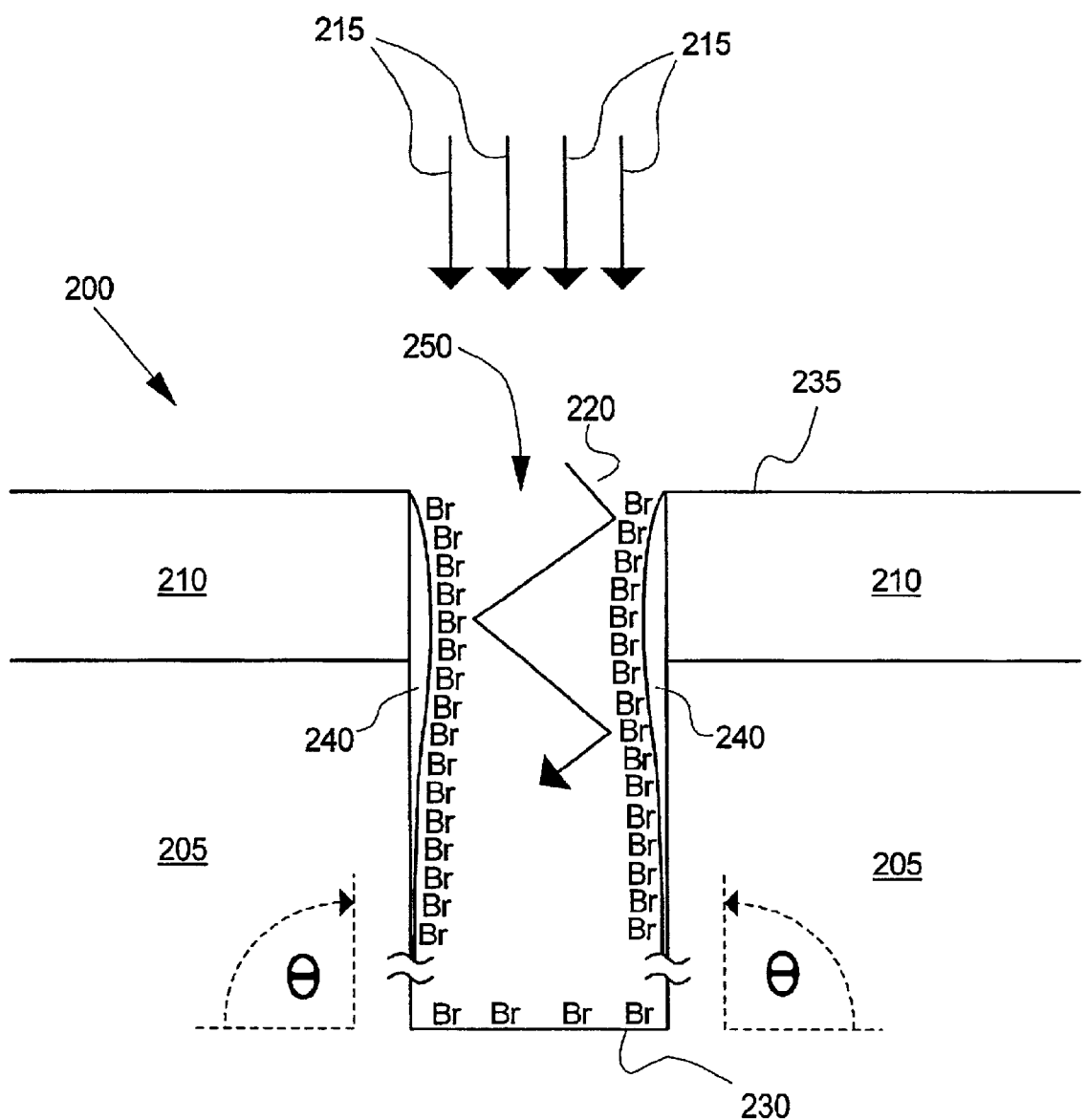

Neutral bromine (or iodine) components from the plasma preferentially absorb or deposit on sidewalls of the aperture without attacking exposed surfaces of the silicon oxide layer 205. The absorbed or deposited components may contain free bromine, free iodine or other neutral components containing bromine or iodine. If the sidewalls of the aperture 250 contain a polymer residue 240 (as shown in FIG. 2B), the bromine (or iodine) components may brominate (or iodize) the polymer, thus passivating the polymer residue 240. If the polymer residue 240 is exposed to the halogen-containing components during formation, the polymer residue 240 may incorporate such halogen-containing components within the polymer layer itself as additional polymer residue is formed overlying the absorbed components. For one embodiment, the composition of the plasma is modified during the etch process such that the bromine- or iodine-containing source gas is not added to the plasma until at least a portion of the polymer residue 240 is formed. For another embodiment, the composition of the plasma is modified during the etch process such that the bromine- or iodine-containing source gas is not added to the plasma until after the polymer residue 240 is formed.

The bromine (or iodine) components sterically hinder any free fluorine 220 from attacking the sidewalls of the aperture 250, with or without a polymer residue 240, thus reducing any tendency to create bowing. In addition, as the energy of absorption of the bromine (or iodine) components is low relative to the energy of the incoming ions 215, the absorption of bromine (or iodine) components will tend to be lessened at the etch front 230 as the incoming ions 215 will suppress accumulation of these components at the etch front; because the incoming ions 215 are accelerated predominantly perpendicularly to the surface 235, bromine (or iodine) components absorbed to the sidewalls will remain relatively undisturbed by the incoming ions 215. The absorption of bromine components is preferred over the absorption of iodine components as the iodine components will be more difficult to dislodge from the etch front 230 and may thus have a tendency to increase taper relative to bromine.

To suppress accumulation of the bromine (or iodine) compounds on the etch front 230 and to provide desirable etch rates, the power supplied to the plasma etching process must be sufficiently high. For plasma etching equipment of the type such as an IPS system available from Applied Materials, Santa Clara, Calif., USA, source power to the chamber is preferably maintained between about 1000 and 2000 watts, and more preferably at about 1500 watts. Bias power to the device 200 or its support is preferably maintained at less than about 1500 watts and greater than about 800 watts, and most preferably greater than about 900 watts. Such power levels are appropriate for etching apertures in 200 mm substrates. Power levels must be scaled, in a manner well known in the art, for larger or smaller substrates.

Processing pressure is generally maintained above approximately 5 mTorr, preferably between about 30 and 60 mTorr, and more preferably at about 45 mTorr. As a general matter, with an increase of pressure in the chamber, the power must also increase to prevent excessive taper in the profile of the aperture.

The source gases are typically delivered to an etch chamber at a total flow rate of preferably between approximately 20 and 80 sccm, and more preferably between approximately 40 and 50 sccm. An inert gas, e.g., helium or argon, may also be delivered to the etch chamber at a flow rate of approximately 0 to 100 sccm, and preferably between approximately 40 and 50 sccm.

The bromine/iodine content of the source gases is an amount sufficient to produce bromine/iodine neutrals capable of passivating the aperture sidewalls, thus protecting the sidewalls from detrimental attack by free fluorine. This amount is dependent upon the source gases chosen to generate the plasma, the temperature/pressure/powers chosen for the plasma etch process, and the aspect ratio of the aperture being formed. The atomic ratio of bromine and/or iodine to fluorine in the source gases is deemed sufficient when a taper angle of greater than or equal to approximately 87° is maintained in the aperture for the given processing conditions. For one embodiment, the bromine/iodine content of the source gases is modified during the etch process as the aspect ratio increases. For a further embodiment, the bromine/iodine content of the source gases is reduced during the etch process as the aspect ratio increases.

Those skilled in the art will recognize that specific values for process conditions are dependent upon the type of etch equipment or tool chosen for the task. Appropriate process conditions must be determined for the chosen tool. One way to determine appropriate process conditions is to choose initial process conditions that produce a desired taper, but unacceptable bowing. The process is then performed using the initial process conditions, but adding bromine- and/or iodine-containing components in the process gas flows at a point in the process preferably prior to the formation of bowing. The addition of bromine- and/or iodine-containing components may occur at the beginning of the process, during formation of a polymer residue, or after formation of the polymer residue. The effect of the bromine and/or iodine addition is then determined and the initial process conditions are modified to produce the desired taper. The modifications to the initial process conditions are suggested to be those modifications that compensate for the effect of the bromine and/or iodine addition. For example, if the addition produces a reduction in taper angle, the preferred modification would be a modification suggested by the tool to increase taper angle. Such modifications could include changes in power, pressure, process gas flows, backside inert gas pressure, etc. This process may be reiterated until a profile having a desired taper and bowing is achieved.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

CONCLUSION

Embodiments described herein utilize a plasma etching process with a plasma containing fluorine as well as bromine and/or iodine for etching high aspect ratio trenches, contact holes or other apertures in silicon oxide materials. The plasma is produced using at least one fluorine-containing source gas and at least one bromine- or iodine-containing source gas. Bromine/iodine components of the plasma protect the aperture sidewalls from lateral attack by free fluorine, thus advantageously reducing a tendency for bowing of the sidewalls. Ion bombardment suppresses absorption or deposit of bromine/iodine components on the etch front, thus facilitating advancement of the etch front without significantly impacting taper. Apertures formed in accordance with the various embodiments may be used, for example, as support structures for the formation of container capacitors and as contact holes and trenches in the fabrication of integrated circuit devices such as memory devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming an aperture in a silicon oxide layer, the method comprising:
   generating a plasma containing fluorine and at least one element selected from the group consisting of bromine and iodine;
   accelerating ions from the plasma toward a surface of the silicon oxide layer; etching an exposed portion of the silicon oxide layer, thereby advancing an etch front into the silicon oxide layer and forming the aperture having sidewalls; absorbing components containing the at least one element on the sidewalls of the aperture; and
   continuing to advance the etch front and absorb components containing the at least one element on the sidewalls of the aperture until a desired aspect ratio is attained;
   wherein the desired aspect ratio is greater than about 5:1; and
   wherein a content of the at least one element is sufficient to produce a taper angle of the sidewalls of greater than about 87° at the desired aspect ratio.

2. The method of claim 1, further comprising forming a polymer residue while advancing the etch front into the silicon oxide layer and depositing the polymer residue on sidewall portions of the silicon oxide layer such that the sidewalls of the aperture contain the polymer residue.

3. The method of claim 2, wherein absorbing components containing the at least one element on the sidewalls of the aperture further comprises absorbing the components on the polymer residue.

4. The method of claim 2, wherein absorbing components containing the at least one element on the sidewalls of the aperture further comprises incorporating the components within the polymer residue.

5. The method of claim 1, wherein accelerating ions from the plasma toward a surface of the silicon oxide layer further comprises accelerating ions from the plasma toward a surface of the silicon oxide layer using a bias power of at least approximately 900 watts.

6. The method of claim 1, wherein generating a plasma containing fluorine and at least one element selected from the group consisting of bromine and iodine further comprises generating a plasma having at least one fluorine-containing source gas and at least one bromine- or iodine-containing source gas.

7. The method of claim 6, wherein generating a plasma having at least one fluorine-containing source gas and at least one bromine- or iodine-containing source gas further comprises generating a plasma having at least one fluorine-containing source gas and modifying a composition of the plasma by adding at least one bromine- or iodine-containing source gas.

8. The method of claim 7, wherein modifying a composition of the plasma occurs during etching an exposed portion of the silicon oxide layer.

9. The method of claim 6, wherein each fluorine-containing source gas is selected from the group consisting of perfluorocarbons and hydrofluorocarbons.

10. The method of claim 9, wherein each fluorine-containing source gas is selected from the group consisting of trifluoromethane, difluoromethane, pentafluoroethane perfluoropropene, perfluoropropane and perfluorobutene.

11. The method of claim 6, wherein any bromine-containing source gas is selected from the group consisting of hydrogen bromide, bromotrifluoromethane, a bromine-substituted fluorocarbon and a bromine-substituted hydrofluorocarbon.

12. The method of claim 6, wherein any iodine-containing source gas is selected from the group consisting of hydrogen iodide, iodotrifluoromethane, an iodine-substituted fluorocarbon and an iodine-substituted hydrofluorocarbon.

13. The method of claim 1, wherein the silicon oxide layer contains a silicon oxide material selected from the group consisting of doped and undoped silicon oxide materials.

14. The method of claim 13, wherein the silicon oxide layer contains a silicon oxide material selected from the group consisting of silicon dioxide, tetraethylorthosilicate, a silicon oxynitride, borosilicate glass, phosphosilicate glass and borophosphosilicate glass.

15. The method of claim 1, wherein accelerating ions from the plasma toward a surface of the silicon oxide layer suppresses absorption of components containing the at least one element on the etch front.

16. The method of claim 1, wherein the aperture is an aperture selected from the group consisting of a hole and a trench.

17. A method of forming an aperture in a silicon oxide layer, the method comprising:
generating a plasma containing fluorine and bromine;
accelerating ions from the plasma toward a surface of the silicon oxide layer;
etching an exposed portion of the silicon oxide layer, thereby exposing sidewalls of the silicon oxide layer;
absorbing components containing bromine on the sidewalls of the silicon oxide layer; and
continuing to etch the exposed portion of the silicon oxide layer and to absorb components containing bromine on the sidewalls of the silicon oxide layer until an aperture having a desired aspect ratio is attained;
wherein the desired aspect ratio is greater than about 5:1; and
wherein a content of the bromine in the plasma is sufficient to produce a taper angle of the sidewalls of greater than about 87° at the desired aspect ratio.

18. The method of claim 17, wherein accelerating ions from the plasma toward a surface of the silicon oxide layer suppresses absorption of components containing bromine on the exposed portion of the silicon oxide layer.

19. A method of forming an aperture in a silicon oxide layer, the method comprising:
generating a plasma containing fluorine and iodine;
accelerating ions from the plasma toward a surface of the silicon oxide layer;
etching an exposed portion of the silicon oxide layer, thereby exposing sidewalls of the silicon oxide layer;
absorbing components containing iodine on the sidewalls of the silicon oxide layer; and
continuing to etch the exposed portion of the silicon oxide layer and to absorb components containing iodine on the sidewalls of the silicon oxide layer until an aperture having a desired aspect ratio is attained;
wherein a content of the iodine in the plasma is sufficient to produce a taper angle of the sidewalls of greater than about 87°.

20. A method of forming an aperture in a silicon oxide layer, the method comprising:
generating a plasma comprising at least one first source gas and at least one second source gas, wherein each at least one first source gas is a fluorocarbon gas and each at least one second source gas is selected from the group consisting of a bromine-containing gas and an iodine-containing gas;
accelerating ions from the plasma perpendicularly toward a surface of the silicon oxide layer;
advancing an etch front in the silicon oxide layer, thereby exposing sidewalls of the silicon oxide layer;
absorbing components from the plasma on the sidewalls of the silicon oxide layer, wherein the absorbed components are selected from the group consisting of bromine-containing components and iodine-containing components and wherein the absorbed components are sufficient to passivate the sidewalls of the silicon oxide layer from attack by fluorine-containing components of the plasma; and
continuing to advance the etch front until a desired aspect ratio is attained, wherein the desired aspect ratio is greater than about 8:1.

21. The method of claim 20, wherein accelerating ions from the plasma perpendicularly toward the surface of the silicon oxide layer suppresses absorption of components from the plasma on the etch front.

22. The method of claim 20, wherein the desired aspect ratio is greater than about 10:1.

23. The method of claim 20, wherein a content of the at least one second source gas is modified relative to the at least one first source gas while advancing the etch front.

24. The method of claim 23, wherein a content of the at least one second source gas is reduced relative to the at least one first source gas while advancing the etch front.

25. A method of forming an aperture in a silicon oxide layer, the method comprising:
generating a plasma comprising at least one fluorocarbon gas and at least one bromine-containing gas;
accelerating ions from the plasma perpendicularly toward a surface of the silicon oxide layer;
advancing an etch front in the silicon oxide layer, thereby exposing sidewalls of the silicon oxide layer;
absorbing bromine-containing components from the plasma on the sidewalls of the silicon oxide layer, wherein the absorbed bromine-containing components are sufficient to passivate the sidewalls of the silicon oxide layer from attack by fluorine-containing components of the plasma; and
continuing to advance the etch front until a desired aspect ratio is attained, wherein the desired aspect ratio is greater than about 8:1.

26. The method of claim 25, wherein accelerating ions from the plasma perpendicularly toward the surface of the silicon oxide layer suppresses absorption of bromine-containing components on the etch front.

27. The method of claim 25, wherein generating a plasma comprising at least one fluorocarbon gas and at least one bromine-containing gas further comprises generating a plasma comprising difluoromethane and hydrogen bromide.

28. A method of forming an aperture in a silicon oxide layer, the method comprising:
generating a plasma comprising at least one fluorocarbon gas and at least one iodine-containing gas;
accelerating ions from the plasma perpendicularly toward a surface of the silicon oxide layer;
advancing an etch front in the silicon oxide layer, thereby exposing sidewalls of the silicon oxide layer;
absorbing iodine-containing components from the plasma on the sidewalls of the silicon oxide layer, wherein the absorbed iodine-containing components are sufficient to passivate the sidewalls of the silicon oxide layer from attack by fluorine-containing components of the plasma; and
continuing to advance the etch front until a desired aspect ratio is attained, wherein the desired aspect ratio is greater than about 8:1.

29. A method of forming an aperture in a silicon oxide layer, the method comprising:
generating a plasma comprising at least one first source gas and at least one second source gas, wherein each at least one first source gas is a fluorocarbon gas and each at least one second source gas contains an element selected from the group consisting of bromine and iodine;
accelerating ions from the plasma perpendicularly toward a surface of the silicon oxide layer;
advancing an etch front in the silicon oxide layer, thereby exposing sidewalls of the silicon oxide layer;
forming a polymer residue on the sidewalls of the silicon oxide layer; passivating the polymer residue on the sidewalls of the silicon oxide layer through reaction with components of the at least one second source gas; and
continuing to advance the etch front until a desired aspect ratio is attained, wherein the desired aspect ratio is greater than about 5:1.

30. The method of claim 29, wherein a bottom width of the aperture is greater than approximately 60% of a top width of the aperture when the desired aspect ratio is attained.

31. The method of claim 29, wherein each first source gas is selected from the group consisting of perfluorocarbons and hydrofluorocarbons.

32. The method of claim 31, wherein each first source gas is selected from the group consisting of trifluoromethane, difluoromethane, pentafluoroethane, perfluoropropene, perfluoropropane and perfluorobutene.

33. The method of claim 29, wherein each second source gas is selected from the group consisting of hydrogen bromide, bromotrifluoromethane, a bromine-substituted fluorocarbon, a bromine-substituted hydrofluorocarbon, hydrogen iodide, iodotrifluoromethane, an iodine-substituted fluorocarbon and an iodine-substituted hydrofluorocarbon.

34. The method of claim 29, wherein the silicon oxide layer contains a silicon oxide material selected from the group consisting of doped and undoped silicon oxide materials.

35. The method of claim 34, wherein the silicon oxide layer contains a silicon oxide material selected from the group consisting of silicon dioxide, tetraethylorthosilicate, a silicon oxynitride, borosilicate glass, phosphosilicate glass and borophosphosilicate glass.

36. The method of claim 29, wherein accelerating ions from the plasma perpendicularly toward a surface of the silicon oxide layer suppresses absorption of components from the second source gases on the etch front.

37. A method of forming an aperture in a silicon oxide layer, the method comprising:
generating a plasma comprising at least one first source gas and at least one second source gas, wherein each at least one first source gas is a fluorocarbon gas and each at least one second source gas is a bromine-containing gas;
accelerating ions from the plasma perpendicularly toward a surface of the silicon oxide layer;
advancing an etch front in the silicon oxide layer, thereby exposing sidewalls of the silicon oxide layer;
forming a polymer residue on the sidewalls of the silicon oxide layer;
brominating the polymer residue on the sidewalls of the silicon oxide layer, thereby passivating the polymer residue from attack by fluorine-containing components of the plasma; and
continuing to advance the etch front until a desired aspect ratio is attained, wherein the desired aspect ratio is greater than about 5:1.

38. The method of claim 37, wherein a bottom width of the aperture is greater than approximately 60% of a top width of the aperture when the desired aspect ratio is attained.

39. A method of forming an aperture in a silicon oxide layer, the method comprising:
generating a plasma comprising at least one first source gas and at least one second source gas, wherein each at least one first source gas is a fluorocarbon gas and each at least one second source gas is an iodine-containing gas;
accelerating ions from the plasma perpendicularly toward a surface of the silicon oxide layer;
advancing an etch front in the silicon oxide layer, thereby exposing sidewalls of the silicon oxide layer;
forming a polymer residue on the sidewalls of the silicon oxide layer;
iodizing the polymer residue on the sidewalls of the silicon oxide layer, thereby passivating the polymer residue from attack by fluorine-containing components of the plasma; and
continuing to advance the etch front until a desired aspect ratio is attained, wherein the desired aspect ratio is greater than about 5:1.

40. The method of claim 39, wherein a bottom width of the aperture is greater than approximately 60% of a top width of the aperture when the desired aspect ratio is attained.

41. A method of forming an aperture in a silicon oxide layer, the method comprising:
generating a plasma comprising at least one first source gas, wherein each at least one first source gas is a fluorocarbon gas;
accelerating ions from the plasma perpendicularly toward a surface of the silicon oxide layer;
advancing an etch front in the silicon oxide layer, thereby exposing sidewalls of the silicon oxide layer;
forming a polymer residue on the sidewalls of the silicon oxide layer; after forming the polymer residue on the sidewalls of the silicon oxide layer, adding at least one second source gas to the plasma while continuing to advance the etch front, wherein each at least one second source gas contains an element selected from the group consisting of bromine and iodine;

passivating the polymer residue on the sidewalls of the silicon oxide layer through reaction with components of the at least one second source gas; and continuing to advance the etch front until a desired aspect ratio is attained.

42. The method of claim 41, wherein the desired aspect ratio is greater than about 5:1.

43. The method of claim 41, wherein each first source gas is selected from the group consisting of perfuorocarbons and hydrofluorocarbons.

44. The method of claim 43, wherein each first source gas is selected from the group consisting of trifluoromethane, difluoromethane, pentafluoroethane, perfluoropropene, perfluoropropane and perfluorobutene.

45. The method of claim 41, wherein each second source gas is selected from the group consisting of hydrogen bromide, bromotrifluoromethane, a bromine-substituted fluorocarbon, a bromine-substituted hydrofluorocarbon hydrogen iodide, iodotrifluoromethane, an iodine-substituted fluorocarbon and an iodine-substituted hydrofluorocarbon.

46. The method of claim 41, wherein the silicon oxide layer contains a silicon oxide material selected from the group consisting of doped and undoped silicon oxide materials.

47. The method of claim 46, wherein the silicon oxide layer contains a silicon oxide material selected from the group consisting of silicon dioxide, tetraethylorthosilicate, a silicon oxynitride, borosilicate glass, phosphosilicate glass and borophosphosilicate glass.

48. The method of claim 41, wherein accelerating ions from the plasma perpendicularly toward a surface of the silicon oxide layer suppresses absorption of components from the second source gases on the etch front.

49. A method of forming an aperture in a silicon oxide layer, the method comprising:

generating a plasma comprising at least one first source gas, wherein each at least one first source gas is a fluorocarbon gas;

accelerating ions from the plasma perpendicularly toward a surface of the silicon oxide layer;

advancing an etch front in the silicon oxide layer, thereby exposing sidewalls of the silicon oxide layer;

forming a polymer residue on the sidewalls of the silicon oxide layer;

after forming a polymer residue on the sidewalls of the silicon oxide layer, adding at least one second source gas to the plasma while continuing to advance the etch front, wherein each at least one second source gas is a bromine-containing gas;

brominating the polymer residue on the sidewalls of the silicon oxide layer, thereby passivating the polymer residue from attack by fluorine-containing components of the plasma; and continuing to advance the etch front until a desired aspect ratio is attained.

50. The method of claim 49, wherein a bottom width of the aperture is greater than approximately 60% of a top width of the aperture when the desired aspect ratio is attained.

51. The method of claim 49, wherein adding at least one second source gas to the plasma begins prior to forming a polymer residue on the sidewalls of the silicon oxide layer.

52. The method of claim 49, wherein adding at least one second source gas to the plasma occurs after forming a polymer residue on the sidewalls of the silicon oxide layer.

53. A method of forming an aperture in a silicon oxide layer, the method comprising:

generating a plasma comprising at least one first source gas, wherein each at least one first source gas is a fluorocarbon gas;

accelerating ions from the plasma perpendicularly toward a surface of the silicon oxide layer;

advancing an etch front in the silicon oxide layer, thereby exposing sidewalls of the silicon oxide layer;

forming a polymer residue on the sidewalls of the silicon oxide layer;

after forming a polymer residue on the sidewalls of the silicon oxide layer, adding at least one second source gas to the plasma while continuing to advance the etch front, wherein each at least one second source gas is an iodine-containing gas;

iodizing the polymer residue on the sidewalls of the silicon oxide layer, thereby passivating the polymer residue from attack by fluorine-containing components of the plasma; and continuing to advance the etch front until a desired aspect ratio is attained.

54. The method of claim 53, wherein a bottom width of the aperture is greater than approximately 60% of a top width of the aperture when the desired aspect ratio is attained.

55. The method of claim 53, wherein adding at least one second source gas to the plasma begins prior to forming a polymer residue on the sidewalls of the silicon oxide layer.

56. The method of claim 53, wherein adding at least one second source gas to the plasma occurs after forming a polymer residue on the sidewalls of the silicon oxide layer.

* * * * *

UNITED STATES PATENT AND TRADEMARK OFFICE
CERTIFICATE OF CORRECTION

PATENT NO.    : 6,921,725 B2
DATED         : July 26, 2005
INVENTOR(S)   : Donohoe, Kevin It is certified that error appears in the above-identified patent and that said Letters Patent is hereby corrected as shown below:

Column 13,
Line 13, "is selected from the group consisting of perfuorocarbons and" should read
-- is selected from the group consisting of perfluorocarbons and --.

Signed and Sealed this

Fourteenth Day of March, 2006

JON W. DUDAS
*Director of the United States Patent and Trademark Office*